(12) United States Patent
Kadota et al.

(10) Patent No.: US 6,185,801 B1
(45) Date of Patent: Feb. 13, 2001

(54) METHOD OF MANUFACTURING SURFACE ACOUSTIC WAVE DEVICE

(75) Inventors: Michio Kadota, Kyoto; Toshimaro Yoneda, Nagaokakyo; Koji Fujimoto, Otsu, all of (JP)

(73) Assignee: Murata Manufacturing Co., Ltd (JP)

( * ) Notice: Under 35 U.S.C. 154(b), the term of this patent shall be extended for 0 days.

(21) Appl. No.: 09/192,774

(22) Filed: Nov. 16, 1998

(30) Foreign Application Priority Data

Dec. 1, 1997 (JP) .................................... 9-330575

(51) Int. Cl.[7] .................................................. H01L 41/00
(52) U.S. Cl. ................ 29/25.35; 310/313 B; 310/313 D; 310/312
(58) Field of Search ........................... 29/25.35; 310/312, 310/313 B, 313 D

(56) References Cited

U.S. PATENT DOCUMENTS 4,442,574 * 4/1984 Wanuga et al. .................. 310/312 X

FOREIGN PATENT DOCUMENTS 61-208916  9/1986  (JP) .
8-32392    2/1996  (JP) .

OTHER PUBLICATIONS

Japanese Patent Abstract (9–55636), Feb. 25, 1997, "Frequency Adjustment Method for Surface Acoustic Wave Element and Device Therefor".

* cited by examiner

*Primary Examiner*—Carl E. Hall
(74) *Attorney, Agent, or Firm*—Keating & Bennett, LLP

(57) ABSTRACT

A method of manufacturing a surface acoustic wave device having a piezoelectric substrate and an interdigital transducer provided thereon, includes the steps of forming a coating layer made of inorganic material or organic material on the piezoelectric substrate so as to cover the interdigital transducer and etching the coating layer via a laser light to adjust an operation frequency of the surface acoustic wave device.

16 Claims, 3 Drawing Sheets

METHOD OF MANUFACTURING SURFACE ACOUSTIC WAVE DEVICE

BACKGROUND OF THE INVENTION

1. Field of the Invention

The present invention relates to a method of manufacturing a surface acoustic wave device such as a surface acoustic wave filter, a surface acoustic wave resonator, or the like, and more particularly, to a method of manufacturing a surface acoustic wave device in which a step of adjusting the frequency thereof is improved.

2. Description of the Related Art

A surface acoustic wave device is used to define various components such as a filter, a resonator, and the like. In manufacturing such a surface acoustic wave device, at least one interdigital transducer (referred to as "IDT" hereinafter) is formed on a piezoelectric substrate. In surface acoustic wave devices, the number of IDTs, and the shape and number of other electrodes are appropriately selected according to the desired component.

When used as a filter or a resonator, the surface acoustic wave device must be manufactured to achieve necessary frequency characteristics. However, there is a problem that frequency characteristics of surface acoustic wave devices deviate from the designed characteristics due to variations of physical properties between various piezoelectric substrates and poor manufacturing precision in forming IDTs.

Therefore, a method of manufacturing a surface acoustic wave device has been proposed in which a frequency can be adjusted by controlling the thickness of a polyimide resin coating layer formed on the surface acoustic wave device (for example, see Japanese Laid-Open Patent Publication Nos. 61-208916 and 8-32392).

More specifically, Japanese Laid-Open Patent Publication No. 61-208916 discloses that an operation frequency of a surface acoustic wave device can be adjusted by depositing a polyimide resin coating layer on a surface acoustic wave substrate so as to have a predetermined thickness.

Japanese Laid-Open Patent Publication No. 8-32392 discloses a method in which a fluorinated polyimide resin coating is formed, by a spin coating method to have a thickness corresponding to an amount of required frequency adjustment, on the substrate surface where a surface acoustic wave propagates. Japanese Laid-Open Patent Publication No. 8-32392 further discloses that the fluorinated polyimide resin coating may be etched by a plasma containing oxygen gas for further adjustment of the frequency.

However, the above-explained conventional methods using a polyimide resin coating can only decrease the operation frequency of the surface acoustic wave device. That is, it has been impossible to adjust an operation frequency of a surface acoustic wave device so that the operation frequency is increased.

In addition, when the fluorinated polyimide resin coating is etched by using a plasma containing oxygen gas, it is necessary to use a vacuum apparatus. Thus, each surface acoustic wave device requiring frequency adjustment must be loaded into a vacuum chamber and the vacuum chamber must be evacuated thereafter. As a result, it takes considerable time to adjust the frequency of a large number of surface acoustic wave devices, which makes the frequency adjustment process have a low through-put.

SUMMARY OF THE INVENTION

To overcome the problems described above, the preferred embodiments of the present invention provide a method of manufacturing a surface acoustic wave device, which is capable of adjusting an operation frequency of the surface acoustic wave device by shifting the operation frequency to both lower and higher frequency sides and which performs the adjustment of the operation frequencies of the surface acoustic wave devices with high through-put.

According to a preferred embodiment of the present invention, a method of manufacturing a surface acoustic wave device having a piezoelectric substrate and an interdigital transducer provided thereon, includes the steps of forming a coating layer made of an inorganic material or an organic material on the piezoelectric substrate so as to cover the interdigital transducer and etching the coating layer via a laser light to adjust an operation frequency of the surface acoustic wave device.

The method may also include the steps of determining whether the operation frequency is to be increased or decreased and selecting a particular inorganic material for the coating layer in the case where the operation frequency is to be increased and selecting a particular organic material for the coating layer in the case where the operation frequency is to be decreased. Then, the step of forming the coating layer is performed based on a result of the selecting step.

The etching step is preferably performed at an atmospheric pressure. The inorganic material is preferably at least one material selected from the group consisting of $SiO_2$, SiO, ZnO, $Ta_2O_5$, $TiO_2$, and $WO_3$. The organic material is preferably at least one material selected from the group consisting of polyimide, parylene and silicone.

According to preferred embodiments of the present invention, the operation frequency can be easily adjusted with high precision, as compared with a conventional method of adjusting the frequency, and a surface acoustic wave device having exact desired frequency characteristics can be reliably provided at a low cost.

For the purpose of illustrating the invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, a method of manufacturing a surface acoustic wave device in accordance with preferred embodiments of the present invention is described with reference to the drawings.

Figure 1:
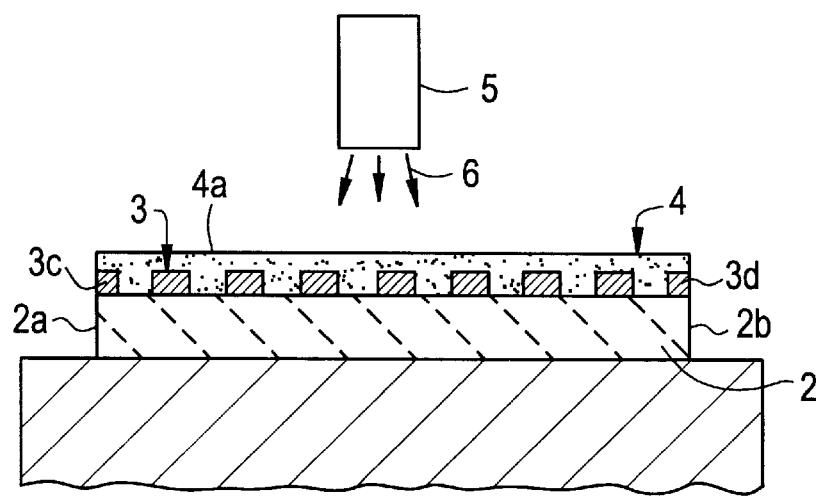
FIG. 1 is a schematic sectional view illustrating the step of adjusting the frequency of a surface acoustic wave device by irradiation of laser light in a preferred embodiment of the present invention.
Figure 2:
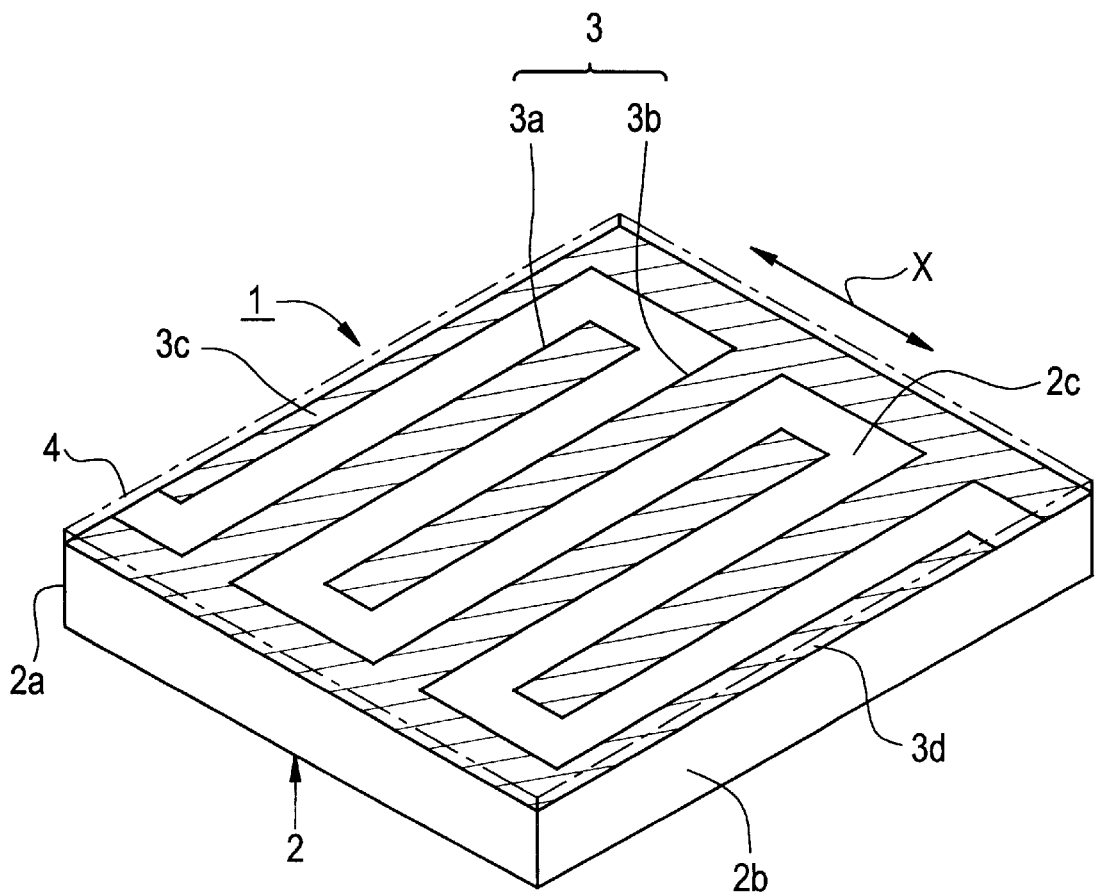
FIG. 2 is a perspective view showing an end-surface reflection type surface wave resonator as a surface acoustic wave device obtained in accordance with a preferred embodiment of the present invention.

FIG. 1 is a schematic sectional view illustrating the step of etching a coating layer via a laser in the method of manufacturing a surface acoustic wave device in accordance with a preferred embodiment of the present invention. FIG. 2 is a perspective view showing the surface acoustic wave device 1 obtained in this preferred embodiment.

In this preferred embodiment, the surface acoustic wave device 1 is an end-surface reflection type surface wave resonator. The surface acoustic wave device 1 includes a piezoelectric substrate 2 and an IDT 3 formed thereon. The piezoelectric substrate 2 may be made of a piezoelectric single crystal of $LiTaO_3$, $LiNbO_3$, or the like. Alternatively, a piezoelectric ceramic such as lead titanate zirconate ceramic or the like may be used. Further, a substrate including an insulating material and a piezoelectric thin film such as a ZnO thin film formed on the substrate may be used.

Comb-shaped electrodes 3a and 3b are arranged on the piezoelectric substrate so that electrode fingers of the comb-shaped electrodes 3a and 3b interdigitate with each other to form the IDT 3. A pair of the outermost electrode fingers of the IDT 3 having a width substantially equal to about half the width of the other electrode fingers are flush with the end-surfaces 2a and 2b of the piezoelectric substrate. In the case where the piezoelectric substrate including the insulating substrate and the piezoelectric thin film on the substrate is used, the IDT 3 may be formed on the piezoelectric thin film, or between the piezoelectric thin film and the substrate made of an insulating material.

The surface acoustic wave device 1 uses, for example, a Bleustein-Gulyaev-Shimizu (BGS) wave. The BGS wave excited by the IDT 3 propagates in the direction X shown in FIG. 2 and is confined between the end surfaces 2a and 2b by the reflection of the BGS wave at the end surfaces 2a and 2b.

In the surface acoustic wave device 1, a coating layer 4 (shown by an imaginary line in FIG. 2) is arranged to cover the IDT 3. The coating layer 4 is made of an inorganic or organic material, and provided and arranged for protecting the IDT 3 and adjusting the frequency. One of the essential features of the present invention is that the coating layer 4 made of either inorganic material or organic material is selectively used. The coating layer made of inorganic material is used for increasing the operation frequency of the surface acoustic wave device, and the coating layer made of organic material is used for decreasing the operation frequency of the surface acoustic wave device.

In this preferred embodiment, the coating layer 4 is formed after the IDT 3 is formed, and the etching step using a laser is then performed for adjusting the operation frequency.

The method for manufacturing the surface acoustic wave device is generally explained as follows.

First, the IDT 3 is formed on the piezoelectric substrate 2. The step of forming the IDT 3 on the piezoelectric substrate 2 can be performed by an appropriate method generally used for a conventional method of manufacturing a surface acoustic wave device. For example, on the entire surface of the piezoelectric substrate 2, a metallic material, such as Al or the like is formed via plating, vapor deposition or sputtering, followed by patterning to form the IDT 3. Alternatively, a mask is placed on the piezoelectric substrate 2, and screen printing, plating, vapor deposition of sputtering of a metallic material such as Al or the like is performed to form the IDT 3.

Then, the surface acoustic wave device 1 is examined using an appropriate frequency characteristic measurement instrument so as to determine the actual operation frequency. The measured actual operation frequency is compared with a designed (or desired) operation frequency of the surface acoustic wave device 1, thereby determining if the actual operation frequency of the surface acoustic wave device should be increased or decreased.

Thereafter, the coating layer 4 is formed on the piezoelectric substrate 2. In the case where the actual operation frequency of the surface acoustic wave device must be increased, an inorganic material is selected for the coating layer 4. On the other hand, in the case where the operation frequency of the surface acoustic wave device must be decreased, an organic material is selected for the coating layer 4. The coating layer 4 can be formed according to a conventional method. For example, the coating layer 4 can be formed by an appropriate method such as spin coating, spray coating, sputtering, vacuum deposition, or the like.

As the material for forming the coating layer 4, various inorganic materials and organic materials can be used. It is preferable to use an inorganic material such as $SiO_2$, SiO, ZnO, $Ta_2O_5$, $TiO_3$, $WO_3$, and the like and an organic material such as polyimide, parylene, silicone and the like.

The thickness of the coating layer 4 is determined so as to be greater than the thickness which causes the frequency change which corresponds to the difference between the actual operation frequency and the desired operation frequency. Note that the relationship between the thickness of the coating layer and the frequency change is to be determined in advance by measuring. The thickness of the coating layer 4 may be changed according to the amount required for each of the surface acoustic wave devices to be adjusted. Alternatively, the thickness of the coating layer 4 may be fixed at a predetermined value which causes a sufficient frequency change for all of the end-surface reflection type surface wave resonators 1 to be adjusted.

Next, the coating layer 4 is irradiated via a laser light 6 by using a laser device 5 to etch the coating layer 4 by burning or vaporizing a portion of the coating layer 4, as shown in FIG. 1. In this etching, the entire upper surface 4a of the coating layer 4 may be etched to decrease the thickness of the coating layer 4, or the upper surface 4a of the coating layer 4 may be partially etched. An amount of etching is controlled by adjusting the power of the laser light. In any case, etching is carried out by using the laser device 5, and thus, etching can be performed with high precision.

During this step, the surface acoustic wave device does not have to be loaded into any vacuum chambers, and etching the coating layer 4 is performed at an atmospheric pressure. As a result, no evacuating time is required for this step.

In addition, a laser light is suitable for etching various kinds of materials regardless of the types of materials. Thus, both the coating layer made of inorganic material and the coating layer made of organic material can be etched by the same laser source without changing the laser sources or the method of etching.

For the forgoing reasons, the frequency characteristics of the surface acoustic wave device can be correctly matched with the desired frequency characteristics by etching regardless of the variations in frequency characteristics of the surface wave device 1 before etching. In addition, the frequency adjustment through-put can be greatly improved.

An experimental example is described below.

As the surface acoustic wave device 1, a surface acoustic wave device including the piezoelectric substrate 2 made of piezoelectric ceramic (PZT) and having dimensions of approximately 50×50×1 mm was prepared. The IDT 3 as formed included 20 pairs of electrode fingers, and was made of an aluminum thin film which was negligibly thin relative to the wavelength.

After measuring an actual operation frequency of the surface acoustic wave device 1, a $SiO_2$ thin film was formed to cover the entire upper surface 2a of the piezoelectric substrate 2 by RF magnetron sputtering so that the thickness satisfied $H/\lambda=0.35$ wherein H represents the thickness of the $SiO_2$ thin film, and $\lambda$ represents the wavelength of the BGS wave excited by the surface acoustic wave device.

The coating layer including the $SiO_2$ thin film was etched by the laser device to decrease the thickness thereof, and the change $\Delta f_0$ in the central frequency $f_0$ was determined. The results are shown in FIG. 3.

Figure 3:
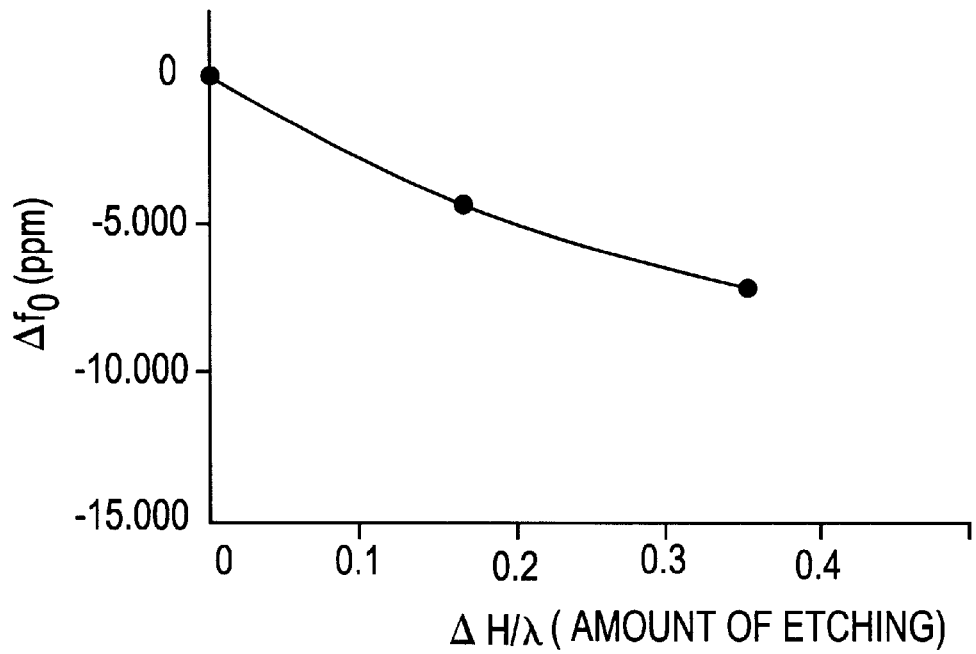
FIG. 3 is a graph showing the relation between the etching amount H/λ of an $SiO_2$ film and the change $\Delta f_0$ in frequency from the central frequency in an experimental example of preferred embodiments of the present invention in which a coating layer was made of the $SiO_2$ film.

In FIG. 3, the change $\Delta f_0$ (ppm) in the central frequency is shown on the ordinate. Here, the central frequency of the surface acoustic wave device having no coating layer 4 formed therein is $f_0$, and a difference in frequency from the central frequency $f_0$ is shown by $\Delta f_0$.

FIG. 3 indicates that by depositing the coating layer including the $SiO_2$ thin film, the central frequency was increased and that by etching the coating layer via laser light to decrease the thickness of the $SiO_2$ thin film, the central frequency is decreased. It was thus discovered that by etching the coating layer by laser light to decrease the thickness thereof, the central frequency of the surface wave device 1 can be adjusted with high precision.

Figure 4:
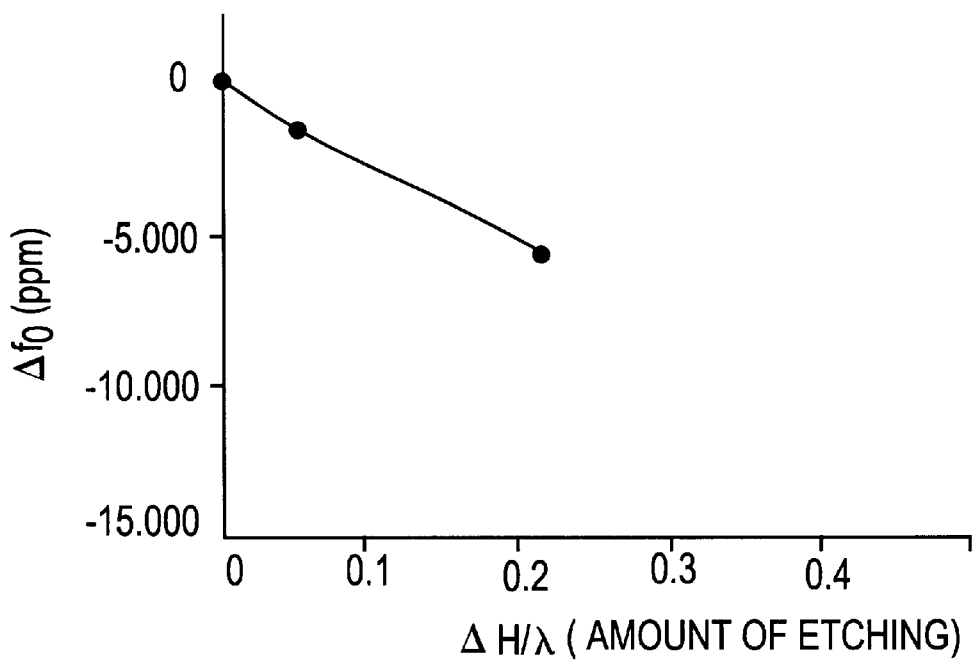
FIG. 4 is a graph showing the relation between the etching amount H/λ of an SiO film and the change $\Delta f_0$ in frequency from the central frequency in another experimental example of the preferred embodiments of the present invention in which a coating layer was made of the SiO film.

In the above experimental example, a SiO thin film was formed in place of the $SiO_2$ thin film so that the thickness satisfied $H/\lambda=0.21$, and then the film was etched by the same method as described above. The results are shown in FIG. 4. FIG. 4 indicates that even in the formation of the SiO coating layer, the central frequency can be adjusted to be decreased by etching the coating layer via laser light to decrease the thickness thereof.

Figure 5:
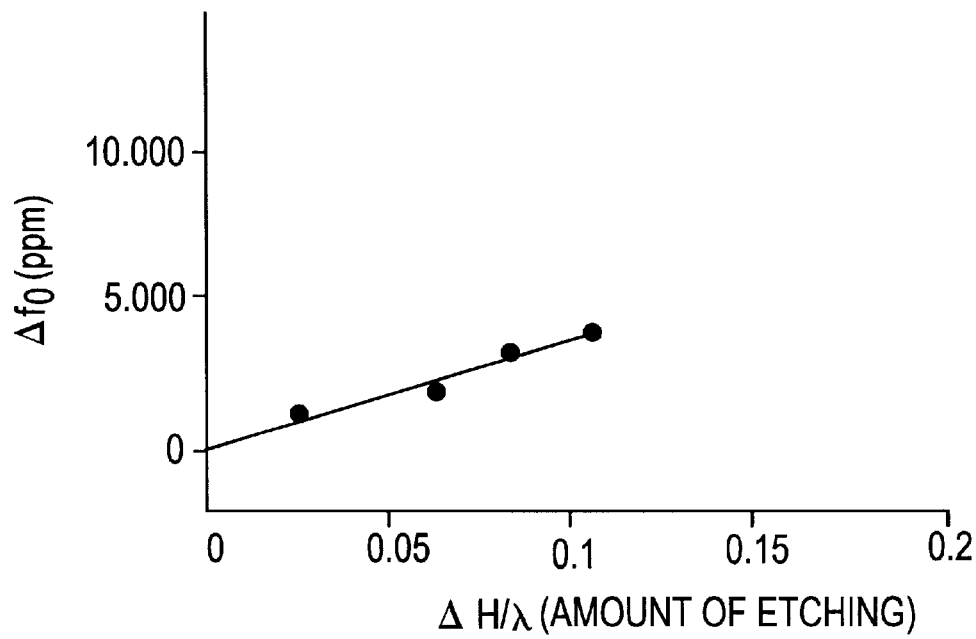
FIG. 5 is a graph showing the relation between the etching amount H/λ of a polyimide film and the change $\Delta f_0$ in frequency from the central frequency in an experimental example of the present invention in which a coating layer was made of preferred embodiments of the polyimide film.

Also, an attempt was made to adjust the frequency by the same method as the above experimental example except that a coating layer of polyimide as an organic material was formed by a using spinner in place of the $SiO_2$ thin film and the SiO thin film so that the thickness satisfied $H/\lambda=0.11$. The results are shown in FIG. 5. FIG. 5 indicates that the central frequency was decreased by forming the coating layer including a polyimide thin film and that etching the coating layer by irradiation with laser light permits frequency adjustment in the direction in which the frequency increases as the etching amount increases, i.e., the thickness of the coating layer including the polyimide thin film decreases.

Figure 6:
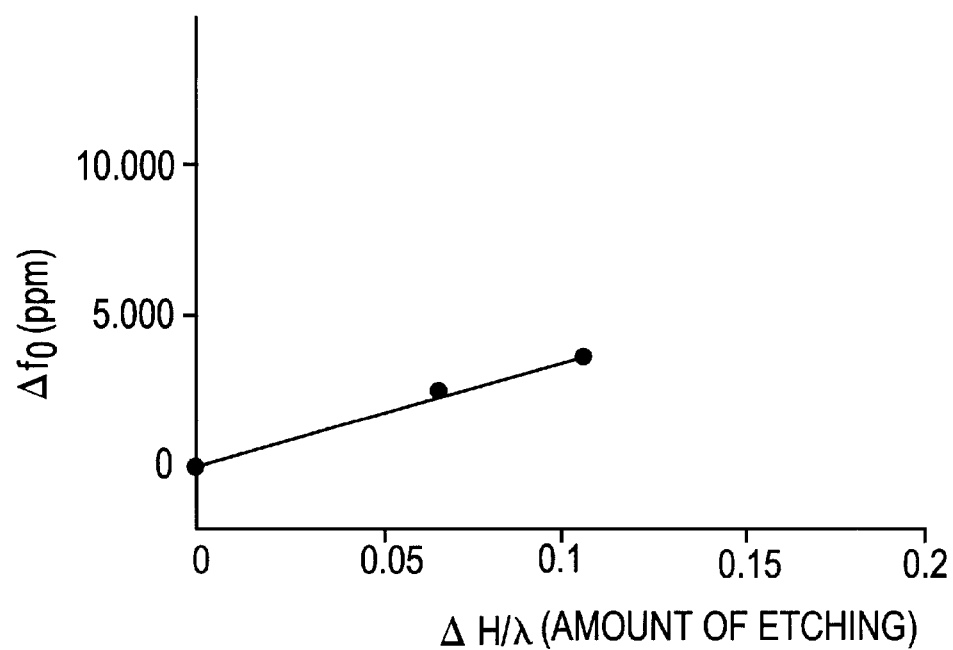
FIG. 6 is a graph showing the relation between the etching amount H/λ of a parylene film and the change $\Delta f_0$ in frequency from the central frequency in an experimental example of preferred embodiments of the present invention in which a coating layer was made of the parylene film.

Similarly, the same experiment was carried out by using parylene instead of polyimide. The results are shown in FIG. 6. FIG. 6 indicates that after the coating layer including parylene is formed, etching the coating layer via irradiation with laser light permits frequency adjustment in such a manner that the frequency is increased by increasing the etching amount, i.e., decreasing the thickness of the coating layer, as in the case of polyimide.

Therefore, the results shown in FIGS. 3 to 6 reveal that in the formation of the coating layer made of an inorganic material, the frequency can be adjusted to be decreased by increasing the etching amount, i.e., decreasing the thickness of the coating layer, while with the use of polyimide or parylene, the frequency can be adjusted to be increased by increasing the etching amount, i.e., decreasing the thickness of the coating layer.

In any case, it was discovered that by etching the coating layer via irradiation with laser light to decrease the thickness thereof, the frequency can be reliably and accurately adjusted to obtain intended frequency characteristics.

Although in the preferred embodiments, the method of manufacturing a surface acoustic wave device of the present invention is applied to the method of manufacturing an end reflection type surface acoustic wave device using a BGS wave, the manufacturing method can also be applied to the manufacture of a surface acoustic wave device using a surface acoustic wave other than the BGS wave, for example, other SH type surface acoustic waves such as a Love wave, and the like and other surface acoustic waves such as a Rayleigh wave and the like. Furthermore, the manufacturing method can be applied to not only a surface acoustic wave resonator but also to any desired surface acoustic wave devices such as a transversal type or resonator type surface acoustic wave filter, a surface acoustic wave delay line, and the like.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A method of manufacturing a surface acoustic wave device having a piezoelectric substrate and an interdigital transducer provided thereon, comprising the steps of:

forming the surface acoustic wave device including the piezoelectric substrate and the interdigital transducer;

determining whether an operation frequency of the surface acoustic wave device is to be increased or decreased;

selecting an inorganic material for a coating layer if the operation frequency is to be increased and selecting an organic material for a coating layer if the operation frequency is to be decreased;

forming, based on a result of the selecting step, the coating layer made of either the inorganic material or the organic material on the piezoelectric substrate so as to cover the interdigital transducer; and etching the coating layer to adjust the operation frequency of the surface acoustic wave device.

2. The method of manufacturing a surface acoustic wave device according to claim 1, wherein the etching step is performed at an atmospheric pressure.

3. The method of manufacturing a surface acoustic wave device according to claim 1, wherein the inorganic material is at least one selected from the group consisting of $SiO_2$, SiO, ZnO, $Ta_2O_5$, $TiO_2$, and $WO_3$.

4. The method of manufacturing a surface acoustic wave device according to claim 1, wherein the organic material is at least one selected from the group consisting of polyimide, parylene and silicone.

5. The method of manufacturing a surface acoustic wave device according to claim 1, wherein the surface acoustic wave device is an end-surface reflection type surface acoustic wave device.

6. The method of manufacturing a surface acoustic wave device according to claim 1, wherein the surface acoustic wave device uses a Bleustein-Gulyaev-Shimizu wave.

7. The method of manufacturing a surface acoustic wave device according to claim 1, wherein the etching step is done using a laser.

8. The method of manufacturing a surface acoustic wave device according to claim 1, wherein the step of determining whether the operation frequency is to be increased or decreased includes the steps of examining a frequency characteristic of the surface acoustic wave device to determine an actual operation frequency and comparing the actual operation frequency to a desired operation frequency.

9. A method of manufacturing a surface acoustic wave device comprising the steps of:

providing a piezoelectric substrate;

forming an interdigital transducer on a surface of the piezoelectric substrate;

determining whether an operation frequency of the surface acoustic wave device is to be increased or decreased;

selecting an inorganic material for a coating layer if the operation frequency is to be increased and selecting an organic material for a coating layer if the operation frequency is to be decreased;

forming, based on a result of the selecting step, the coating layer made of either the inorganic material or the organic material on the piezoelectric substrate to cover the interdigital transducer; and etching the coating layer to increase or decrease the operation frequency of the surface acoustic wave device.

10. The method of manufacturing a surface acoustic wave device according to claim 9, wherein the etching step is performed at an atmospheric pressure.

11. The method of manufacturing a surface acoustic wave device according to claim 9, wherein the inorganic material is at least one selected from the group consisting of $SiO_2$, SiO, ZnO, $Ta_2O_5$, $TiO_2$, and $WO_3$.

12. The method of manufacturing a surface acoustic wave device according to claim 9, wherein the organic material is at least one selected from the group consisting of polyimide, parylene and silicone.

13. The method of manufacturing a surface acoustic wave device according to claim 9, wherein the surface acoustic wave device is an end-surface reflection type surface acoustic wave device.

14. The method of manufacturing a surface acoustic wave device according to claim 9, wherein the surface acoustic wave device uses a Bleustein-Gulyaev-Shimizu wave.

15. The method of manufacturing a surface acoustic wave device according to claim 9, wherein the etching step is done using a laser.

16. The method of manufacturing a surface acoustic wave device according to claims 10, wherein the step of determining whether the operation frequency is to be increased or decreased includes the steps of examining a frequency characteristic of the surface acoustic wave device to determine an actual operation frequency and comparing the actual operation frequency to a desired operation frequency.

* * * * *